(12) United States Patent
Greenwood et al.

(10) Patent No.: US 10,027,076 B2
(45) Date of Patent: *Jul. 17, 2018

(54) CURRENT CARRYING SYSTEMS AND METHODS OF ASSEMBLING THE SAME

(71) Applicant: General Electric Company, Schenectady, NY (US)

(72) Inventors: Peter James Greenwood, Cheshire, CT (US); Michael Ray Bryant, Mebane, NC (US); Shyam Ramlal Mathure, Andhra Pradesh (IN); Venkateswara Rao Polineni, Andhra Pradesh (IN); Anandaroop Bhattacharya, Karnataka (IN); Subhashish Dasgupta, Karnataka (IN); Sunil Srinivasa Murthy, Karnataka (IN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 71 days.

This patent is subject to a terminal disclaimer.

(21) Appl. No.: 15/235,222

(22) Filed: Aug. 12, 2016

(65) Prior Publication Data
US 2016/0380420 A1   Dec. 29, 2016

Related U.S. Application Data

(63) Continuation of application No. 14/189,346, filed on Feb. 25, 2014, now Pat. No. 9,431,782.

(51) Int. Cl.
*H01R 25/14* (2006.01)
*H05K 7/20* (2006.01)
(Continued)

(52) U.S. Cl.
CPC ............. *H01R 25/14* (2013.01); *H01R 13/46* (2013.01); *H02B 1/565* (2013.01); *H02G 5/10* (2013.01);
(Continued)

(58) Field of Classification Search
CPC .................................................... H01R 39/48
See application file for complete search history.

(56) References Cited

U.S. PATENT DOCUMENTS 3,018,320 A   1/1962   Rowe
3,621,108 A   11/1971  Cleaveland
(Continued)

FOREIGN PATENT DOCUMENTS

CN     102549864 A    7/2012
CN     202602096 U    12/2012
(Continued)

OTHER PUBLICATIONS

"Characteristics and Applications of Busbar", Suzhou Huatong Compound Materials Co.,Ltd., Feb. 5, 2013.
(Continued)

*Primary Examiner* — James Harvey
(74) *Attorney, Agent, or Firm* — GE Global Patent Operation; Stephen G. Midgley

(57) ABSTRACT

A current carrying system for use in transporting electrical current between a plurality of electrical devices is provided. The current carrying system includes a busbar having a first axial end, a second axial end, an electrically conductive shaft extending from the first axial end to the second axial end, and at least one cooling feature defined in at least a portion of the electrically conductive shaft. The current carrying system also includes a casing that defines a busbar channel configured to receive the busbar such that the casing at least partially circumscribes the busbar. The current carrying system also includes an air vent defined by the at least one cooling feature and the casing, wherein the air vent is in flow communication with ambient air, and the cooling feature is configured to facilitate a flow of air from the ambient air through the air vent.

20 Claims, 10 Drawing Sheets

(51) Int. Cl.
  H01R 13/46 (2006.01)
  H02B 1/56 (2006.01)
  H02G 5/10 (2006.01)
  H01R 39/48 (2006.01)
  H02B 1/21 (2006.01)

(52) U.S. Cl.
  CPC ......... H05K 7/20145 (2013.01); H01R 39/48 (2013.01); H02B 1/21 (2013.01)

(56) References Cited

U.S. PATENT DOCUMENTS

| | | |
|---|---|---|
| 3,829,647 A | 8/1974 | Cleaveland |
| 4,025,826 A | 5/1977 | Wilson et al. |
| 5,101,080 A | 3/1992 | Ferenc |
| 5,166,861 A | 11/1992 | Krom |
| 5,316,490 A | 5/1994 | Clemence et al. |
| 6,215,681 B1 | 4/2001 | Schuurman et al. |
| 6,265,666 B1 | 7/2001 | Faulkner |
| 6,420,655 B1 | 7/2002 | Yang et al. |
| 6,433,271 B1 | 8/2002 | Arnborg |
| 6,616,465 B1 | 9/2003 | Fontana et al. |
| 6,689,956 B2 | 2/2004 | Alexander et al. |
| 6,786,749 B2 | 9/2004 | Meiners et al. |
| 7,252,524 B1 | 8/2007 | Johnson, Jr. et al. |
| 7,786,384 B2 | 8/2010 | Diaz |
| 7,952,875 B2 | 5/2011 | Woody et al. |
| 9,431,782 B2* | 8/2016 | Greenwood ............ H01R 13/46 |
| 2001/0028547 A1 | 10/2001 | Wagener |
| 2003/0003785 A1 | 1/2003 | Ross |
| 2006/0116011 A1 | 6/2006 | Sinclair |
| 2009/0068866 A1 | 3/2009 | Sinclair et al. |
| 2010/0051342 A1 | 3/2010 | Diaz |
| 2010/0167636 A1 | 7/2010 | Bhattacharya et al. |
| 2010/0302733 A1 | 12/2010 | Woody et al. |
| 2011/0075327 A1 | 3/2011 | Schmid |
| 2011/0236739 A1 | 9/2011 | Watanabe et al. |
| 2012/0222881 A1 | 9/2012 | Van Dooren et al. |
| 2013/0164595 A1 | 6/2013 | Takase et al. |
| 2013/0258557 A1 | 10/2013 | Dhar et al. |
| 2014/0298734 A1* | 10/2014 | Rogers ............ E04B 1/343 52/79.9 |
| 2015/0244122 A1 | 8/2015 | Greenwood et al. |
| 2016/0380420 A1* | 12/2016 | Greenwood ........... H01R 13/46 174/547 |

FOREIGN PATENT DOCUMENTS

| | | |
|---|---|---|
| CN | 202696090 U | 1/2013 |
| EP | 0821454 A1 | 1/1998 |

OTHER PUBLICATIONS

Machine Translation and First Office Action and Search issued in connection with corresponding CN Application No. 201510087379.9 dated Jul. 11, 2017.

* cited by examiner

CURRENT CARRYING SYSTEMS AND METHODS OF ASSEMBLING THE SAME

CROSS REFERENCE TO RELATED APPLICATIONS

This application is a continuation of U.S. patent application Ser. No. 14/189,346 filed Feb. 25, 2014, which is hereby incorporated by reference in its entirety.

BACKGROUND

The field of the disclosure relates generally to current carrying systems, and, more specifically, to current carrying systems having at least one profiled busbar that facilitates increased current carrying capacity.

Existing current carrying systems generally include one or more solid electrically conductive busbars that transport electrical power between a plurality of electrical components. For example, the busbars may be used to transport power between a generator and a motor. However, known current carrying systems have a limited current carrying capacity due, at least partially, to thermal limits associated with the busbars. More specifically, known busbars that carry more than a rated amount of current are susceptible to overheating, possibly damaging the busbar, the current carrying system, and/or the electrical devices coupled to the busbar.

Generally, the current carrying capacity of a busbar is determined by the amount of electrically conductive material utilized in constructing each of the busbars. Specifically, increasing the amount of electrically conductive material in the busbar facilitates reducing the current density in the busbar when an equal current is being carried. The reduced current density reduces the temperature increase of the busbar caused by resistive current losses, and allows additional current to be carried. However, electrically conductive material, such as copper, is often expensive and/or difficult to acquire. Accordingly, known methods of increasing the current carrying capacity of the system add significant manufacturing costs.

In other known current carrying systems, current carrying capacity is increased by actively cooling the busbar, e.g., with active cooling elements such as fans or blowers. The active cooling elements cause air to flow over the busbars increasing convective heat transfer from the busbars to the surrounding air. However, active cooling components have significant drawbacks. For example, active cooling components typically require a separate power source to operate, require a significant amount of space to operate, and require continuous maintenance to prevent overheating of the busbars. Accordingly, current carrying systems with active cooling components may be more expensive and complicated to manufacture than passive current carrying systems.

BRIEF DESCRIPTION

In one aspect, a current carrying system for use in transporting electrical current between a plurality of electrical devices is provided. The current carrying system includes a busbar having a first axial end, a second axial end, an electrically conductive shaft extending from the first axial end to the second axial end, and at least one cooling feature defined in at least a portion of the electrically conductive shaft. The current carrying system also includes a casing that defines a busbar channel configured to receive the busbar such that the casing at least partially circumscribes the busbar. The current carrying system also includes an air vent defined by the at least one cooling feature and the casing, wherein the air vent is in flow communication with ambient air, and the cooling feature is configured to facilitate a flow of air from the ambient air through the air vent.

In another aspect, a busbar for transporting electrical power between a plurality of electrical components is provided. The busbar includes a first axial end, a second axial end, and an electrically conductive shaft extending from the first axial end to the second axial end. The shaft is at least partially circumscribed by a casing. The busbar also includes at least one cooling feature defined in at least a portion of the electrically conductive shaft, the at least one cooling feature and the casing defining an air vent in flow communication with ambient air, the at least one cooling feature configured to facilitate a flow of the ambient air through the air vent.

In yet another aspect, a method of assembling a current carrying system for transporting electrical power between a plurality of electrical components is provided. The method includes providing a busbar having a first axial end, a second axial end, an electrically conductive shaft extending from the first axial end to the second axial end, and at least one cooling feature defined in at least a portion of the electrically conductive shaft, and coupling a casing to at least a portion of the busbar, wherein an inner surface of the casing at least partially circumscribes the busbar, wherein the at least one cooling feature and the inner surface of the casing define an air vent, and wherein the at least one cooling feature is configured to facilitate a flow of the ambient air through the air vent.

DETAILED DESCRIPTION

The current carrying system described herein has profiled busbars with at least one cooling feature. The cooling feature facilitates increasing convective heat transfer by the busbar and reducing the amount of electrically conductive material used in fabricating the busbar. Accordingly, the current carrying systems described herein have a reduced capital cost. The current carrying systems described herein also have an increased current carrying capacity. Furthermore, the current carrying systems described herein are less likely to overheat and be damaged.

Figure 1:
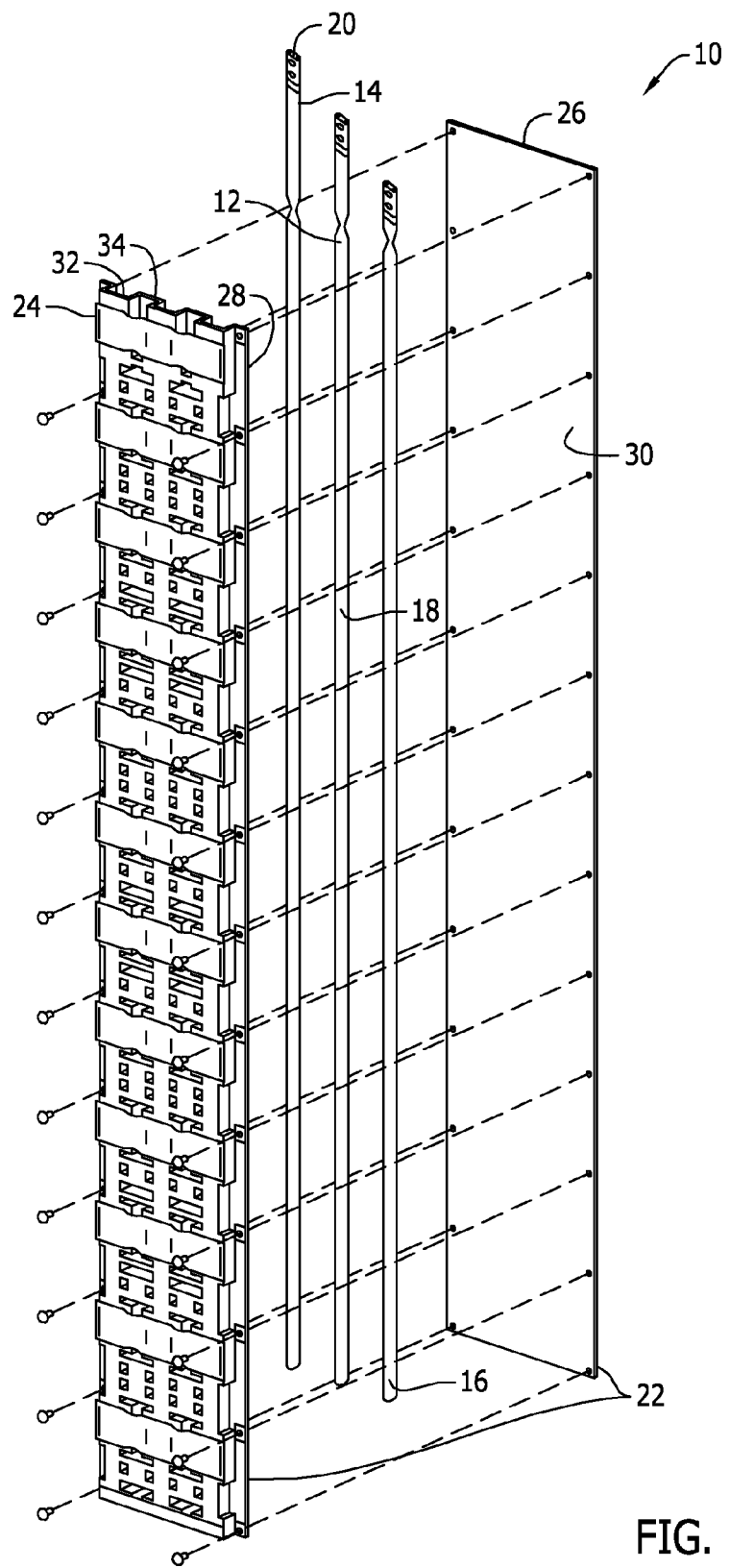
FIG. 1 is an exploded view of an exemplary current carrying system for use in transporting power between a plurality of electrical components.

FIG. 1 is an exploded view of an exemplary current carrying system 10 for use in transporting current between a plurality of electrical devices (not shown). Current carrying system 10 has at least one busbar 12 that is configured to deliver the current between the plurality of electrical devices. Busbar 12 includes a first axial end 14, a second axial end 16, and an electrically conductive shaft 18 that extends between first axial end 14 and second axial end 16. Shaft 18 is fabricated with an electrically conductive material, e.g., without limitation, copper, aluminum, gold, zinc, nickel, silver, and/or any other material that enables busbar 12 to transport current from one electrical device to another. In the exemplary embodiment, busbar 12 also includes a cooling feature 20, i.e., a notch, groove, cut-out, and/or void space, defined in shaft 18 from first axial end 14 to second axial end 16. Alternatively, cooling feature 20 may be defined in only a portion of shaft 18. Cooling feature 20 facilitates improving convective heat transfer by busbar 12. In addition, cooling feature 20 facilitates reducing the cost of busbar 12 by reducing the amount of conductive material used in fabricating busbar 12 for the same rated current.

In the exemplary embodiment, busbar 12 is fabricated in an extrusion process during which the electrically conductive material is forced through a shaped die such that shaft 18 has a substantially uniform cross-sectional shape conforming to the die. Alternatively, busbar 12 may be fabricated using any other process that enables busbar 12 to function as described herein. Busbar 12 is configured to transport currents for any type of power, such as, for example, DC (direct current) power, single phase AC (alternating current) power, and/or true three-phase power.

In the exemplary embodiment, busbar 12 is oriented substantially vertically with respect to the earth such that warmed air within cooling feature 20 rises substantially vertically along electrically conductive shaft 18 toward first axial end 14. Alternatively, busbars 12 may be oriented at any angle with respect to the earth such that the warmed air rises toward first axial end 14.

Current carrying system 10 also includes a casing 22 that at least partially circumscribes busbars 12. More specifically, casing 22 includes a first barrier 24 and a second barrier 26 coupled to first barrier 24. In the example embodiment, first barrier 24 and second barrier 26 are fabricated from a solid dielectric material, e.g., without limitation, glastic, glass, porcelain, plastic, silicon, quartz, etc. Alternatively, first barrier 24 and second barrier 26 may be fabricated from any type of material so long as an inner surface 28 of first barrier 24 and an inner surface 30 of second barrier 26 are electrically insulated. In one embodiment, first barrier 24 has an axial cross-sectional profile defined by a plurality of alternating recesses 32 and projections 34 such that, when assembled, casing 22 defines at least one busbar channel (not shown in FIG. 1) configured to receive busbar 12.

Figure 2:
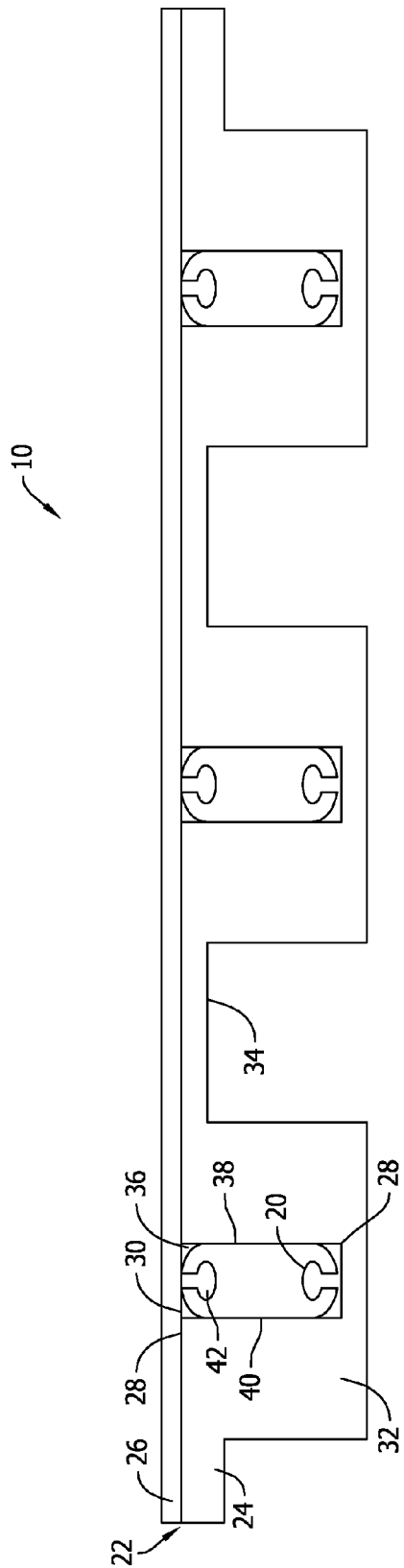
FIG. 2 is an axial cross-sectional view of the current carrying system shown in FIG. 1.

FIG. 2 is a cross-sectional view of current carrying system 10 (shown in FIG. 1) having at least one profiled busbar 12 to facilitate convective heat transfer. First barrier 24 has a plurality of alternating recesses 32 and projections 34 such that first barrier 24 has a substantially corrugated cross-sectional profile. In one embodiment, first barrier 24 has a uniform cross-sectional profile throughout. Alternatively, recesses 32 and projections 34 may have varying widths throughout first barrier 24. Second barrier 26 has a substantially rectangular cross-sectional profile and is coupled to first barrier 24. More specifically, inner surface 30 of second barrier 26 couples with inner surface 28 of first barrier 24 at each projection 34. Furthermore, recesses 32 define a plurality of busbar channels 36 between inner surface 28 and inner surface 30. In the exemplary embodiment, recesses 32 and projections 34 are substantially rectangular in shape such that busbar channels 36 have a substantially rectangular profile. Alternatively, recesses 32 and projections 34 may have any shape such that enables busbar channels 36 to operate as described herein. For example, busbar channels 36 may have a substantially hemispheric, circular, trapezoidal, or other shaped profile. In one embodiment busbar channels 36 may vary In the exemplary embodiment, a plurality of busbars 12 are positioned within respective busbar channels 36 of casing 22. More specifically, the plurality of busbars 12 are positioned within busbar channel 36 such that cooling feature 20 defines an air vent 42 between busbar 12 and inner surface 28 and/or inner surface 30 of casing 22. In one embodiment, the plurality of busbars 12 are positioned within busbar channels 36 such that a first edge 38 and second edge 40 of at least a portion of each busbar 12 are coupled to inner surface 28 of casing 22. In another embodiment, at least a portion of each busbar 12 is fitted within a respective busbar channel 36 such that the portion of busbar 12 has a tight tolerance with busbar channel 36 except at cooling feature 20.

In the exemplary embodiment, air vent 42 is defined axially throughout current carrying system 10 from first axial end 14 to second axial end 16. Alternatively, air vent 42 may be defined along only a portion of busbar 12. Air vent 42 is configured to receive air from the ambient environment, for example, proximate to second axial end 16, and to expel warmed air to the ambient environment, for example, proximate first axial end 14. More specifically, air vent 42 is configured to channel air from the ambient environment through cooling feature 20 to facilitate convective heat transfer by busbar 12. As used herein, 'ambient air' refers to air from the ambient environment outside of (i.e., above, below, or otherwise external to) casing 22.

Figure 3:
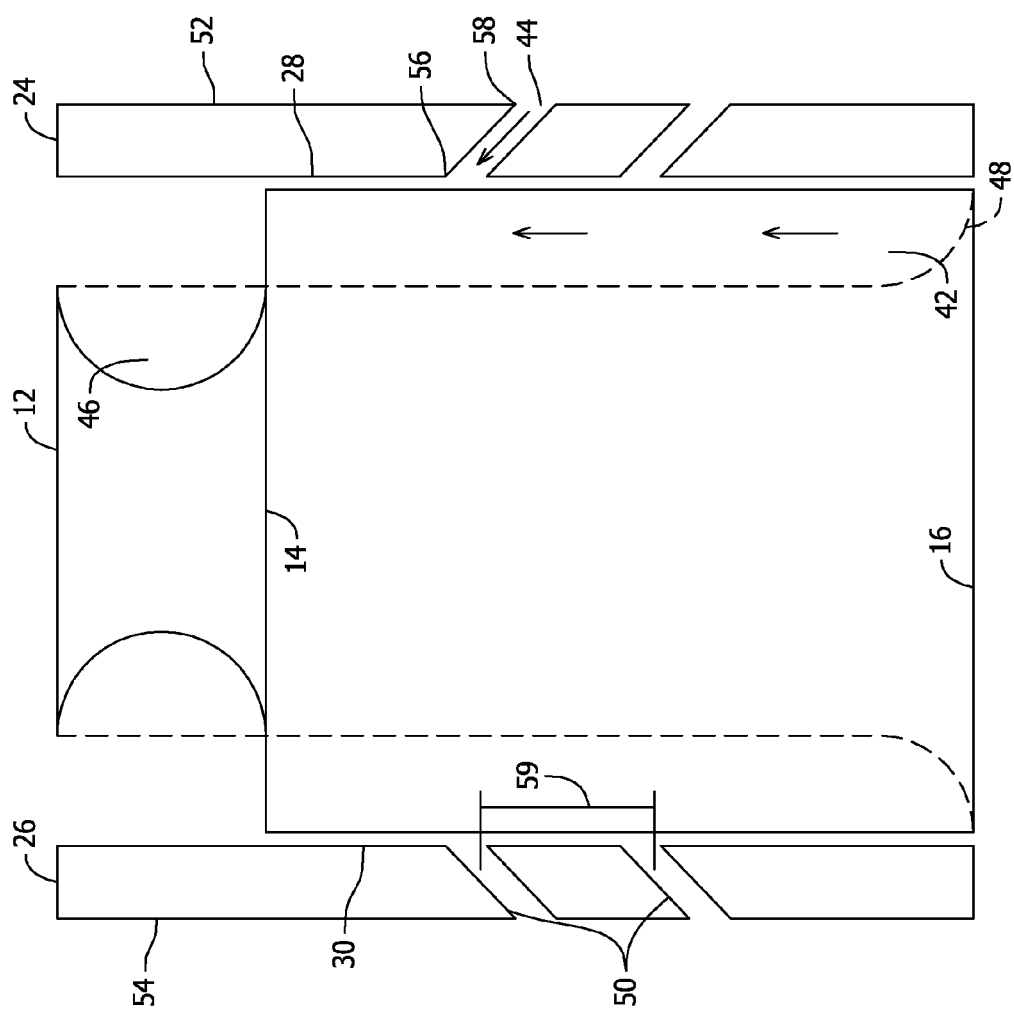
FIG. 3 is a side cross-sectional view of the current carrying system shown in FIG. 1.

FIG. 3 is a side cross-sectional view of the current carrying system 10 (shown in FIG. 1). FIG. 3 illustrates the flow of air 44 throughout current carrying system 10. More specifically, during operation, an electrical current flows through busbar 12 from one electrical device (not shown) to another electrical device (not shown). Resistive losses caused by the flow of current through busbar 12 produce heat that conducts from busbar 12 to first barrier 24 and/or second barrier 26. The produced heat is convected from busbar 12 to air 44 within air vent 42. As air 44 within air vent 42 is warmed by busbar 12, the warmed air 44 flows through cooling feature 20 toward first axial end 14. In one embodiment, air 44 is expelled at an apex opening 46 that defines the top axial end of air vent 42 proximate first axial end 14 of busbar 12. Alternatively, air 44 may exit air vent 42 through any other opening that enables air vent 42 to operate as described herein. As air 44 exits apex opening 46, a negative air pressure is formed within air vent 42. The negative air pressure entrains air 44 from the ambient environment into air vent 42 through, for example, a base opening 48. Base opening 48 defines the bottom axial end of air vent 42 and is proximate second axial end 16 of busbar 12. Alternatively, air 44 may enter air vent 42 through any other opening. This chimney effect generates a continuous draft through cooling feature 20 and air vent 42 to facilitate passively cooling busbar 12 through convective heat transfer.

In the exemplary embodiment, casing 22 has one or more air passages 50 defined therein for entraining air 44 from the ambient environment to air vent 42. Air passages 50 are conduits that extend through casing 22 from inner surface 28 and/or 30 (shown in FIG. 2) to respective outer surfaces 52 and/or 54. More specifically, air passages 50 have an outer opening 56 defined by outer surface 52 and/or 54 and an inner opening 58 defined by respective inner surface 28 and/or 30. In some embodiments, air passages 50 extend through casing 22 partially in an axial direction, i.e., vertically. More specifically, air passages 50 extend axially through casing 22 such that inner openings 58 are spaced axially apart from outer openings 56. In such an implementation, air passage 50 enables air 44 to flow into air vent 42 with a velocity component at least partially in the same direction as air 44 flowing through cooling feature 20.

In the exemplary embodiment, the plurality of air passages 50 are shaped as rectangular slits that extend from inner surface 28 and/or 30 to outer surface 52 and/or 54. Alternatively, the plurality of air passages 50 may have any cross-sectional shape, including for example circular, that enables air passages 50 to operate as described herein. Further, in the exemplary embodiment, the plurality of air passages 50 are spaced axially apart at predetermined intervals 59 along casing 22 such that air 44 enters air vent 42 at a plurality of axially displaced locations.

In operation, air passages 50 transport air 44 from the ambient environment through casing 22 into air vent 42. Air 44 flows through cooling feature 20 of air vent 42 to facilitate passively cooling busbars 12. More specifically, as warmed air 44 is expelled from apex opening 46, negative air pressure in air vent 42 generates a draft that entrains air 44 to flow from the ambient environment through air passages 50 to air vent 42. The flow of air 44 over through cooling channel 20 facilitates improving heat convection by busbar 12.

In one embodiment, first barrier 24 and second barrier 26 are assembled such that busbar channel 36 circumscribes busbars 12 with a tight tolerance except at cooling feature 20. Accordingly, each air vent 42 is defined substantially by cooling feature 20 and inner surface 28 or 30 of casing 22.

Figure 4:
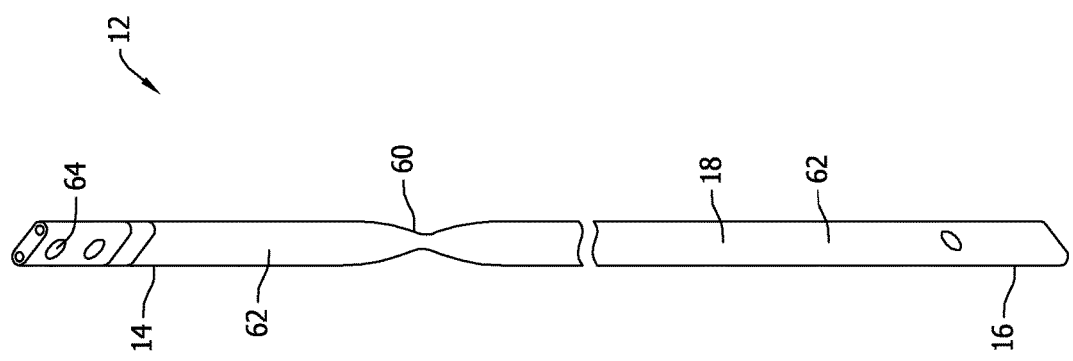
FIG. 4 is a perspective view of a busbar for use in transporting power between a plurality of electrical components.

FIG. 4 is an isometric view of one of the plurality of busbars 12 shown in FIG. 1. As described above, busbar 12 has a first axial end 14 and a second axial end 16 with an electrically conductive shaft 18 extending therebetween. In the exemplary embodiment, Busbar 12 is a twisted conductor that facilitates coupling busbar 12 with additional components, such as a horizontal busbar (not shown). More specifically, busbar 12 has a twisted portion 60 defined in shaft 18 that rotates a face 62 from a first orientation proximate first axial end 14 to a second orientation proximate second axial end 16. Twisted portion 60 is defined over any length of electrically conductive shaft 18 to control the rate at which face 62 changes orientation. For example, twisted portion 60 may be defined by a relatively short section of shaft 18 such that the orientation of face 62 changes rapidly from the first orientation to the second orientation. Alternatively, twisted portion 60 may be defined over a relatively long section of shaft 18 such that face 62 slowly changes from the first orientation to the second orientation. In other embodiments, shaft 18 is substantially straight and does not include a twisted portion 60.

In the exemplary embodiment, busbar 12 also includes a plurality of receiving slots 64 that extend through electrically conductive shaft 18. Each receiving slot 64 is configured to receive at least one fastener (not shown), e.g., without limitation a screw, a bolt, a clip, a pin, an adhesive compound, and/or any other element that is capable of coupling busbar 12 to another electrical device. For example, busbar 12 may be coupled to a horizontal busbar (not shown) to further transport current from a first electrical device to a second electrical device.

Figure 5:
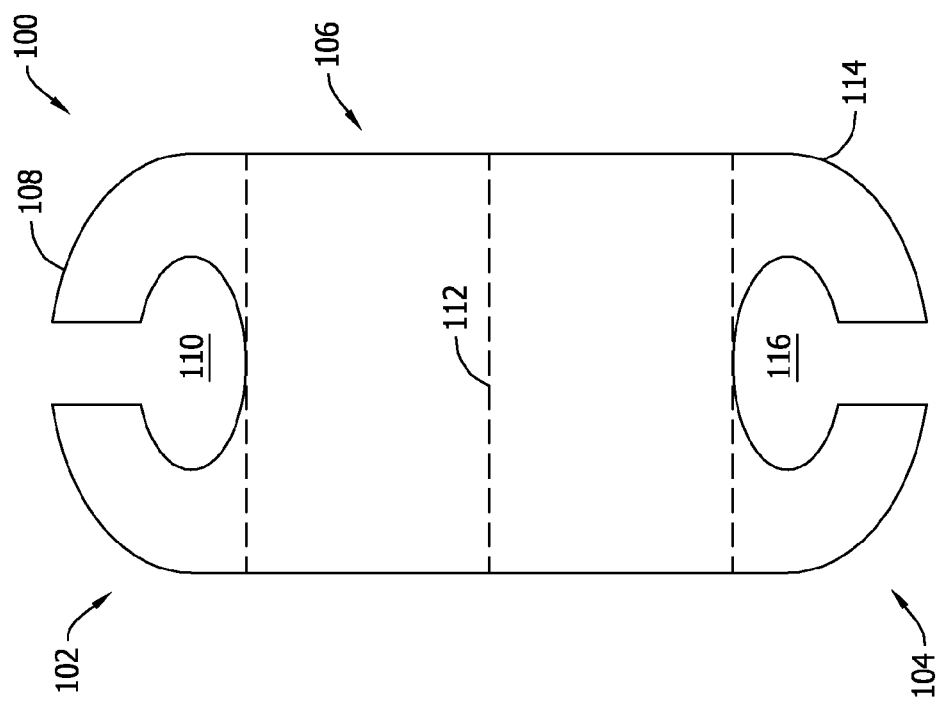
FIG. 5 is a view of an exemplary cross-sectional profile of the busbar shown in FIG. 4.

FIG. 5 is a view of an exemplary axial cross-sectional profile 100 of busbar 12 (shown in FIG. 1) for use in current carrying system 10 (shown in FIG. 1). Profile 100 has a top region 102, a bottom region 104, and a substantially solid rectangular central region 106 that extends from top region 102 to bottom region 104. Top region 102 includes a pair of fins 108 that extend away from central region 106 and define a cooling feature 110 therebetween. In the exemplary embodiment, fins 108 extend from central region 106 and curve radially inward toward each other. In such an embodiment, fins 108 facilitate clipping an electrical device (not shown) to busbar 12. More specifically, a clip (not shown) couples busbar 12 and the electrical device together, and curved fins 108 facilitate reducing the pressure exerted by the clip on top region 102. Accordingly, the clip does not exert full pressure on busbar 12 until it reaches central region 106. Although shown as a pair of fins 108, top region 102 may include any number of fins that define any number of cooling features 110. In the exemplary embodiment, cooling feature 110 is a substantially elliptical and/or circular notch defined in top region 102.

In the example embodiment, bottom region 104 is substantially symmetrical with top region 102 about an axis 112 extending through central region 106. Specifically, bottom region 104 includes a second pair of fins 114 that extend away from central region 106 and define a second cooling feature 116 therebetween. Alternatively, bottom region 104 may have a different number of fins 114 and/or cooling features 116. For example, bottom region 104 may not have any fins 114, and may be substantially solid with a hemispheric shape.

As used herein, the terms top, bottom, left, and right, are used merely for explanation of the figures and are not limiting with respect to the orientation of the object in physical space. For example, a top region may be physically located evenly with or below a bottom region.

Figure 6:
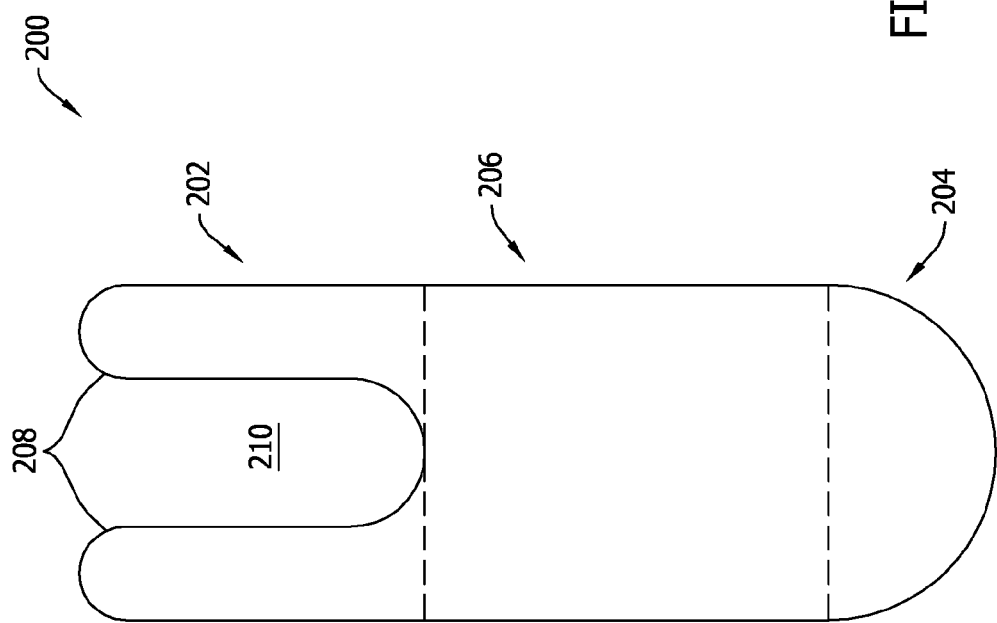
FIG. 6 is a view of a first alternative cross sectional profile of the busbar shown in FIG. 4.

FIG. 6 is a view of a first alternative axial cross-sectional profile 200 of busbar 12 (shown in FIG. 1) for use in current carrying system 10 (shown in FIG. 1). In the first alternative embodiment, profile 200 has a top region 202, a bottom region 204, and a substantially solid rectangular central region 206 that extends from top region 202 to bottom region 204. Top region 202 includes a pair of fins 208 that extend away from central region 206 and define a cooling feature 210 therebetween. Fins 208 extend away from central region 206 and are substantially straight and parallel to each other such that cooling feature 210 is substantially U-shaped. Additionally, bottom region 204 extends away from central region 206 and has a hemispheric shape. Bottom region 204 is substantially solid and does not include a cooling feature 210.

Figure 7:
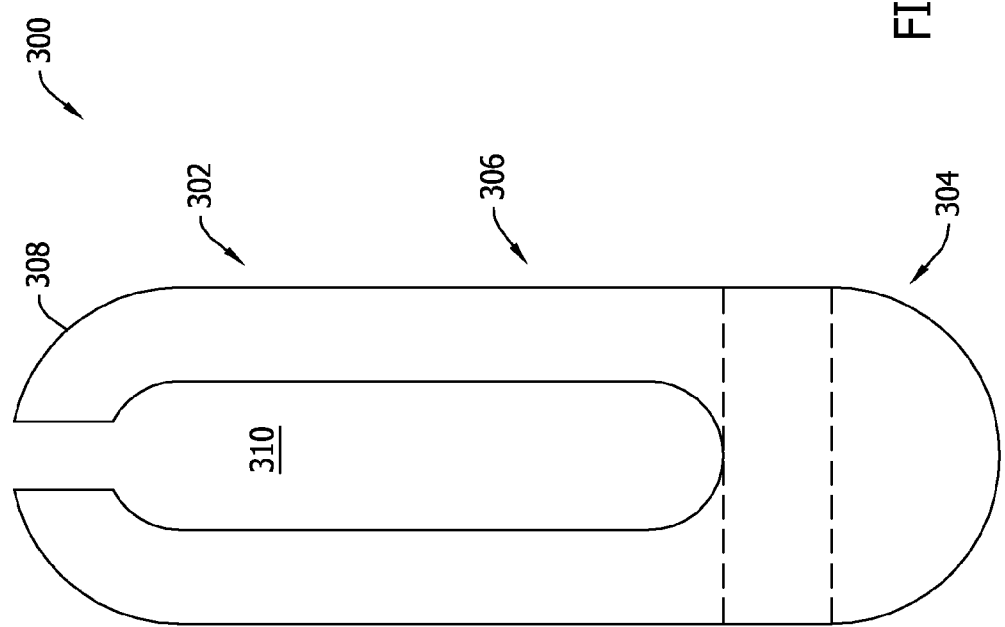
FIG. 7 is a view of a second alternative cross-sectional profile of the busbar shown in FIG. 4.

FIG. 7 is a view of a second alternative axial cross-sectional profile 300 of busbar 12 (shown in FIG. 1) for use in current carrying system 10 (shown in FIG. 1). In the second alternative embodiment, profile 300 has a top region 302, a bottom region 304, and a central region 306 that extends from top region 302 to bottom region 304. Top region 302 includes a pair of fins 308 that extend away from central region 306 and define a cooling feature 310 therebetween. Specifically, fins 308 extend away from central region 306 and curve radially inward toward each other such that cooling feature 310 is substantially elliptical in shape.

Additionally, bottom region 304 extends away from central region 306 and has a substantially solid hemispheric shape.

Figure 8:
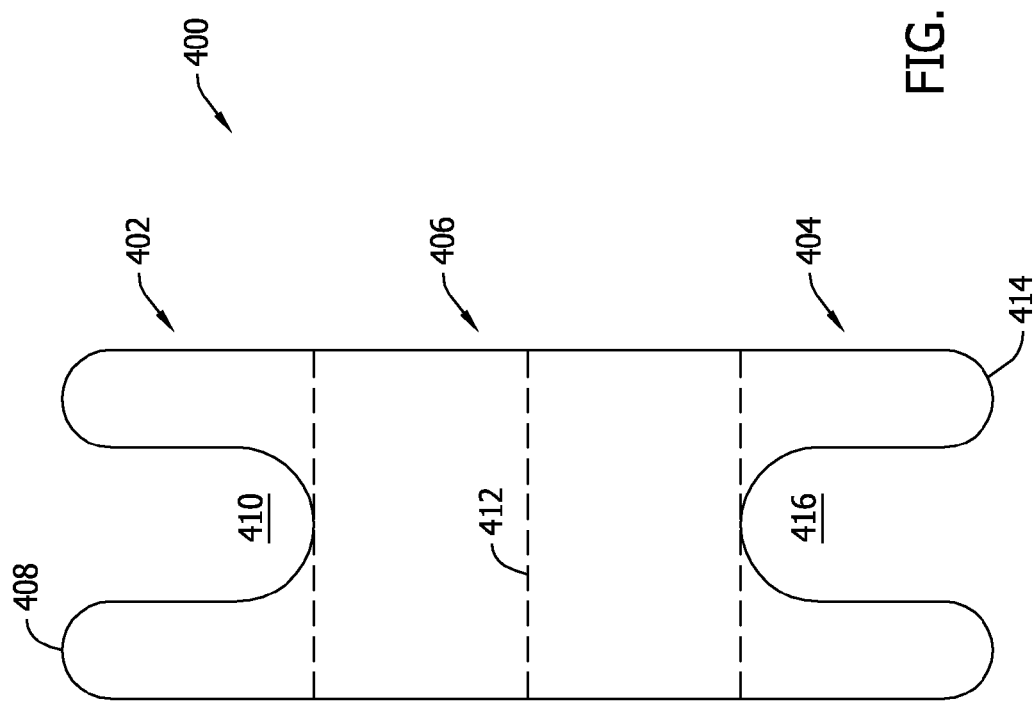
FIG. 8 is a view of a third alternative cross-sectional profile of the busbar shown in FIG. 4.

FIG. 8 is a view of a third alternative axial cross-sectional profile 400 of busbar 12 (shown in FIG. 1) for use in current carrying system 10 (shown in FIG. 1). In the third alternative embodiment, profile 400 has a top region 402, a bottom region 404, and a central region 406 that extends from top region 402 to bottom region 404. Top region 402 includes a pair of fins 408 that extend away from central region 406 and define a cooling feature 410 therebetween. Specifically, fins 408 extend straight away from central region 406 and are parallel to each other such that cooling feature 410 is substantially U-shaped. Additionally, bottom region 404 extends away from central region 406 and is substantially symmetric with top region 402 about a central axis 412. Specifically, bottom region 404 includes a second pair of fins 414 extending away from central region 406. Second pair of fins 414 define a second cooling feature 416 having a substantially U-shaped profile therebetween.

Figure 9:
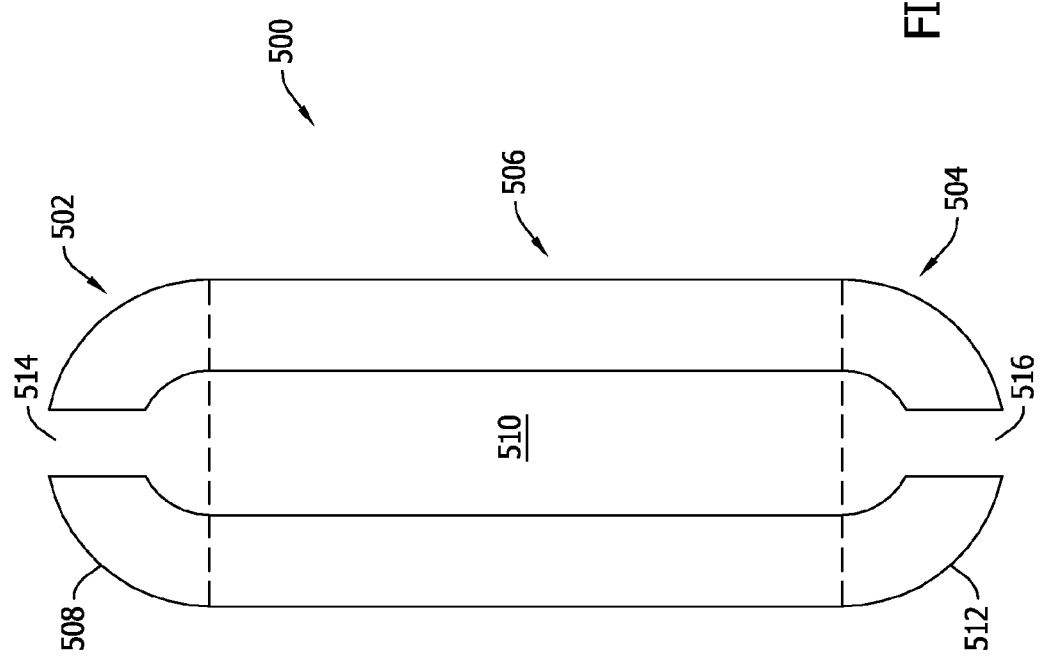
FIG. 9 is a view of a fourth alternative cross-sectional profile of the busbar shown in FIG. 4.

FIG. 9 is a view of a fourth alternative axial cross-sectional profile 500 of busbar 12 (shown in FIG. 1) for use in current carrying system 10 (shown in FIG. 1). In the fourth alternative embodiment, profile 500 has a top region 502, a bottom region 504, and a central region 506 that extends from top region 502 to bottom region 504. Top region 502 includes a pair of fins 508 that extend away from central region 506 and curve radially inward toward each other. Fins 508 define a portion of cooling feature 510 therebetween. Bottom region 504 includes a pair of fins 512 that extend away from central region 506 in an opposite direction to top region 502 and curve radially inward toward each other. Fins 512 also define a portion of cooling feature 510 therebetween. Cooling feature 510 extends from top region 502 to bottom region 504. A first opening 514 extends through top region 502 to cooling feature 510 and a second opening 516 extend through bottom region 504 to cooling feature 510.

Figure 10:
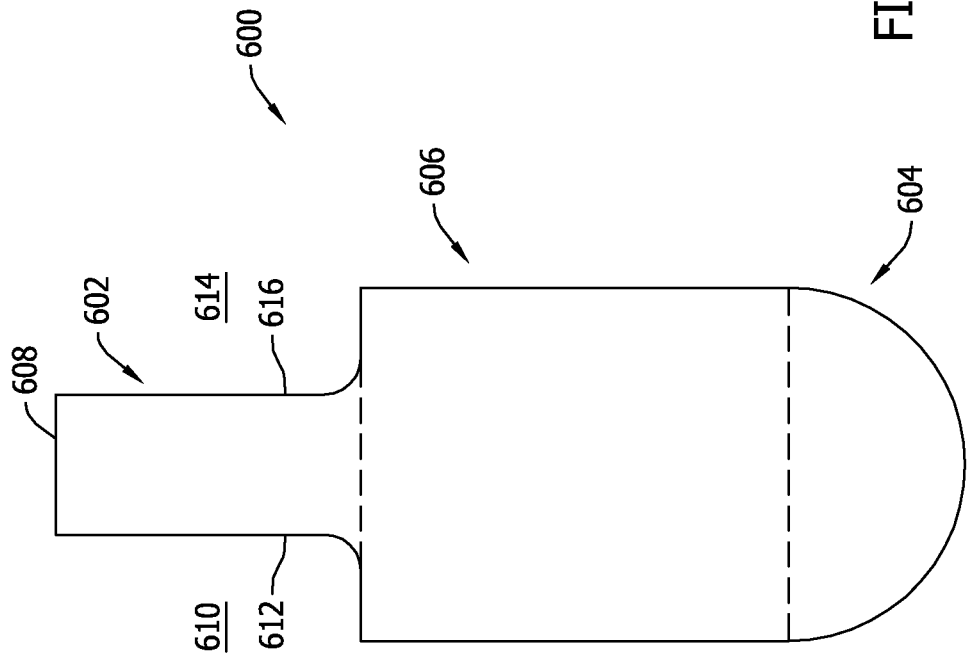
FIG. 10 is a view of a fifth alternative cross-sectional profile of the busbar shown in FIG. 4.

FIG. 10 is a view of a fifth alternative axial cross-sectional profile 600 of busbar 12 (shown in FIG. 1) for use in current carrying system 10 (shown in FIG. 1). In the fifth alternative embodiment, profile 600 has a top region 602, a bottom region 604, and a central region 606 that extends from top region 602 to bottom region 604. Top region 602 includes a fin 608 that extends away from central region 606, for example from the center of central region 606. Fin 608 defines a portion of first cooling feature 610 on a first side 612 and a portion of a second cooling feature 614 on a second side 616. Bottom region 604 extends away from central region 606 and has a substantially solid hemispheric shape. Central region 606 is solid and has a substantially rectangular shape.

Although described above with respect to several alternative cross-sectional busbar profiles, the present disclosure contemplates that additional cross-sectional profiles may be understood to one of ordinary skill in the art in view of the disclosure. Features of any of the described embodiments may be included with features of any other embodiment such that current carrying system 10 functions as described herein. Furthermore, although described with respect to a plurality of busbars 12, current carrying system 10 may include only a single busbar.

The embodiments described herein provide a current carrying system having a profiled busbar that facilitates increased current carrying capacity and/or increased heat transfer. More specifically, the current carrying system described herein includes a plurality of profiled busbars having at least one cooling feature, such as a notch, groove, void space, and/or cut-out, defined therein. The cooling features are defined axially through at least a portion of the busbar, and facilitate reducing the amount of electrically conductive material used in fabricating the busbar as compared to a solid busbar. The current carrying system also includes a casing including a plurality of barriers, e.g., without limitation, dielectric and/or glastic barriers. When assembled, the barriers define a plurality of busbar channels configured to receive respective busbars. In particular, each of the plurality of busbars is positioned within a respective busbar channel such that at least a portion of the busbar is fitted within the busbar channel with a tight tolerance except for at the cooling feature. The cooling features are formed on the outer surface of the busbars such that the cooling features and the inner surface of the casing define a plurality of air vents. The air vents are in flow communication with air in the ambient environment and facilitate convective heat transfer by the busbars. More specifically, each air vent entrains relatively cool air from the ambient environment through at least one opening into the respective air vent. The operation of the cooling features to passively generate a draft that entrains relatively cool air into the air vent is referred to herein as the "chimney effect". In one embodiment, the casing includes at least one air passage that extends through the casing from the ambient environment to the air vent. The draft generated by the cooling features also entrains air through respective air passages to further facilitate convective heat transfer by the busbars.

The current carrying system described above facilitates increasing convective heat transfer by the busbars while reducing the cost of the busbar for the same rated current. The current carrying systems described herein also have an increased current carrying capacity, enabling more cost effective busbars to provide greater amounts of current to electrical devices. Furthermore, the current carrying systems described herein are less likely to be damaged or damage other electrical devices due to overheating.

Exemplary embodiments of systems and methods for cooling a busbar are described above. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A current carrying system for use in transporting electrical current between a plurality of electrical devices, said current carrying system comprising:
    a busbar comprising a first axial end, a second axial end, an electrically conductive shaft extending from the first axial end to the second axial end, and at least one cooling feature defined in at least a portion of said electrically conductive shaft;
    a casing that defines a busbar channel configured to receive said busbar such that said casing at least partially circumscribes said busbar; and
    an air vent defined by said at least one cooling feature and said casing, said air vent comprising an apex opening proximate said first axial end and a base opening proximate said second axial end, wherein said air vent is in flow communication with ambient air, and wherein said at least one cooling feature is configured to facilitate a flow of the ambient air through said air vent.

2. The current carrying system of claim 1, wherein said at least one cooling feature is at least one of a notch, a cut-out, a void space, and a groove.

3. The current carrying system of claim 1, wherein said casing comprises a first barrier and a second barrier coupled to said first barrier, and wherein said first barrier is coupled to at least a portion of said busbar.

4. The current carrying system of claim 3, wherein said first barrier comprises a plurality of alternating recesses and projections, said projections configured to be coupled to said second barrier, and said recesses configured to define said busbar channel.

5. The current carrying system of claim 1, wherein said casing comprises an air passage that extends from the ambient air to said air vent, said air passage configured to entrain air from the ambient environment into said air vent.

6. The current carrying system of claim 1, wherein said busbar has a cross-sectional profile including a top region, a bottom region, and a substantially solid rectangular central region extending therebetween.

7. A current carrying system for use in transporting electrical current between a plurality of electrical devices, said current carrying system comprising:
    a busbar comprising a first axial end, a second axial end, an electrically conductive shaft extending from the first axial end to the second axial end, and at least one cooling feature defined in at least a portion of said electrically conductive shaft;
    a casing comprising a first barrier and a second barrier coupled to said first barrier, said first barrier comprising a plurality of alternating recesses and projections, said projections configured to be coupled to said second barrier, said recesses configured to define a busbar channel configured to receive said busbar such that said casing at least partially circumscribes said busbar, wherein said first barrier is coupled to at least a portion of said busbar; and
    an air vent defined by said at least one cooling feature and said casing, wherein said air vent is in flow communication with ambient air, and wherein said at least one cooling feature is configured to facilitate a flow of the ambient air through said air vent.

8. The current carrying system of claim 7, wherein said at least one cooling feature is at least one of a notch, a cut-out, a void space, and a groove.

9. The current carrying system of claim 7, wherein said air vent comprises an apex opening proximate said first axial end and a base opening proximate said second axial end.

10. The current carrying system of claim 7, wherein said casing comprises an air passage that extends from the ambient air to said air vent, said air passage configured to entrain air from the ambient environment into said air vent.

11. The current carrying system of claim 10, wherein said air passage has an inner opening and an outer opening axially spaced from said inner opening.

12. The current carrying system of claim 11, wherein said inner opening is positioned vertically above said outer opening to enable a velocity component of the air in said air passage to be in the same direction as the air in said air vent.

13. A current carrying system for use in transporting electrical current between a plurality of electrical devices, said current carrying system comprising:
    a busbar comprising a first axial end, a second axial end, an electrically conductive shaft extending from the first axial end to the second axial end, and at least one cooling feature defined in at least a portion of said electrically conductive shaft, said busbar further comprising a cross-sectional profile including a top region, a bottom region, and a substantially solid rectangular central region extending therebetween, said top region comprising a pair of fins that extend away from said central region in a curved manner and define said at least one cooling feature therebetween;
    a casing that defines a busbar channel configured to receive said busbar such that said casing at least partially circumscribes said busbar; and
    an air vent defined by said at least one cooling feature and said casing, wherein said air vent is in flow communication with ambient air, and wherein said at least one cooling feature is configured to facilitate a flow of the ambient air through said air vent.

14. The current carrying system of claim 13, wherein said at least one cooling feature is at least one of a notch, a cut-out, a void space, and a groove.

15. The current carrying system of claim 13, wherein said air vent comprises an apex opening proximate said first axial end and a base opening proximate said second axial end.

16. The current carrying system of claim 13, wherein said casing comprises a first barrier and a second barrier coupled to said first barrier, and wherein said first barrier is coupled to at least a portion of said busbar.

17. The current carrying system of claim 13, wherein said casing comprises an air passage that extends from the ambient air to said air vent, said air passage configured to entrain air from the ambient environment into said air vent.

18. A busbar for use in transporting electrical current between a plurality of electrical devices, said busbar comprising:
    a first axial end, a second axial end, and an electrically conductive shaft extending from said first axial end to said second axial end, said electrically conductive shaft comprising a cross-sectional profile comprising a top region, a bottom region, and a substantially solid rectangular central region extending therebetween, wherein said electrically conductive shaft is at least partially circumscribed by a casing; and at least one cooling feature defined in at least a portion of said electrically conductive shaft, said top region of said electrically conductive shaft comprising a pair of fins that extend away from said central region in a curved manner and define said at least one cooling feature therebetween, said at least one cooling feature and the casing defining an air vent in flow communication with ambient air, said at least one cooling feature configured to facilitate a flow of the ambient air through said air vent.

19. The busbar of claim 18, wherein said at least one cooling feature is at least one of a notch, a cut-out, a void space, and a groove.

20. The busbar of claim 18, wherein the casing has an air passage that extends from the ambient air to said air vent, said air passage configured to entrain air from the ambient environment through said at least one cooling feature.

* * * * *